(12) United States Patent
Lin et al.

(10) Patent No.: US 11,205,713 B2
(45) Date of Patent: Dec. 21, 2021

(54) FINFET HAVING A NON-FACETED TOP SURFACE PORTION FOR A SOURCE/DRAIN REGION

(71) Applicant: Taiwan Semiconductor Manufacturing Company, Ltd., Hsinchu (TW)

(72) Inventors: Tzu-Ching Lin, Hsinchu (TW); Chien-I Kuo, Chiayi County (TW); Wei Te Chiang, Hsinchu (TW); Wei Hao Lu, Taoyuan (TW); Li-Li Su, ChuBei (TW); Chii-Horng Li, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 280 days.

(21) Appl. No.: 16/206,464

(22) Filed: Nov. 30, 2018

(65) Prior Publication Data

US 2019/0109217 A1 Apr. 11, 2019

Related U.S. Application Data

(62) Division of application No. 15/640,645, filed on Jul. 3, 2017, now Pat. No. 10,453,943.

(Continued)

(51) Int. Cl.
*H01L 29/66* (2006.01)
*H01L 29/167* (2006.01)
(Continued)

(52) U.S. Cl.
CPC ...... *H01L 29/66795* (2013.01); *H01L 21/461* (2013.01); *H01L 27/0886* (2013.01);
(Continued)

(58) Field of Classification Search
CPC ............. H01L 29/66795; H01L 21/461; H01L 29/0847; H01L 29/167; H01L 29/26;
(Continued)

(56) References Cited

U.S. PATENT DOCUMENTS 8,043,920 B2 * 10/2011 Chan ................. H01L 29/66795
438/300
8,362,574 B2 * 1/2013 Kawasaki ......... H01L 29/66795
257/401

(Continued)

FOREIGN PATENT DOCUMENTS

CN 102169853 A 8/2011
CN 103681347 A 3/2014
(Continued)

*Primary Examiner* — Allen L Parker
*Assistant Examiner* — Charles N Ausar-El
(74) *Attorney, Agent, or Firm* — Slater Matsil, LLP

(57) ABSTRACT

An embodiment is a method including forming a raised portion of a substrate, forming fins on the raised portion of the substrate, forming an isolation region surrounding the fins, a first portion of the isolation region being on a top surface of the raised portion of the substrate between adjacent fins, forming a gate structure over the fins, and forming source/drain regions on opposing sides of the gate structure, wherein forming the source/drain regions includes epitaxially growing a first epitaxial layer on the fin adjacent the gate structure, etching back the first epitaxial layer, epitaxially growing a second epitaxial layer on the etched first epitaxial layer, and etching back the second epitaxial layer, the etched second epitaxial layer having a non-faceted top surface, the etched first epitaxial layer and the etched second epitaxial layer forming source/drain regions.

20 Claims, 20 Drawing Sheets

Related U.S. Application Data

(60) Provisional application No. 62/427,599, filed on Nov. 29, 2016.

(51) Int. Cl.
*H01L 29/78* (2006.01)
*H01L 27/088* (2006.01)
*H01L 29/161* (2006.01)
*H01L 21/461* (2006.01)
*H01L 29/08* (2006.01)
*H01L 29/26* (2006.01)
*H01L 29/06* (2006.01)

(52) U.S. Cl.
CPC ........ *H01L 29/0847* (2013.01); *H01L 29/161* (2013.01); *H01L 29/167* (2013.01); *H01L 29/26* (2013.01); *H01L 29/785* (2013.01); *H01L 29/7848* (2013.01); *H01L 29/7853* (2013.01); *H01L 29/0653* (2013.01)

(58) Field of Classification Search
CPC ............... H01L 29/7848; H01L 29/785; H01L 27/0886; H01L 29/7853; H01L 29/161
See application file for complete search history.

(56) References Cited

U.S. PATENT DOCUMENTS

| | | | | |
|---|---|---|---|---|
| 8,362,575 B2 * | | 1/2013 | Kwok | H01L 29/045 257/368 |
| 8,377,779 B1 | | 2/2013 | Wang | |
| 8,440,517 B2 * | | 5/2013 | Lin | H01L 21/02293 438/197 |
| 8,659,032 B2 * | | 2/2014 | Chao | H01L 29/66795 257/77 |
| 8,836,016 B2 | | 9/2014 | Wu et al. | |
| 8,841,701 B2 | | 9/2014 | Lin et al. | |
| 8,847,293 B2 | | 9/2014 | Lee et al. | |
| 8,853,025 B2 | | 10/2014 | Zhang et al. | |
| 8,946,033 B2 * | | 2/2015 | Adam | H01L 29/66795 438/300 |
| 8,962,400 B2 | | 2/2015 | Tsai et al. | |
| 9,093,514 B2 | | 7/2015 | Tsai et al. | |
| 9,236,267 B2 | | 1/2016 | De et al. | |
| 9,245,805 B2 | | 1/2016 | Yeh et al. | |
| 9,257,538 B2 | | 2/2016 | Mieno | |
| 9,355,914 B1 * | | 5/2016 | Leobandung | H01L 29/66545 |
| 9,368,495 B2 * | | 6/2016 | Kim | H01L 29/7842 |
| 9,412,731 B2 * | | 8/2016 | Kim | H01L 27/0207 |
| 9,450,047 B1 * | | 9/2016 | Liao | H01L 29/0847 |
| 9,472,669 B1 | | 10/2016 | Chiang et al. | |
| 9,515,156 B2 | | 12/2016 | Besser et al. | |
| 9,520,393 B2 | | 12/2016 | Loubet et al. | |
| 9,520,482 B1 | | 12/2016 | Chang et al. | |
| 9,576,814 B2 | | 2/2017 | Wu et al. | |
| 9,653,574 B2 | | 5/2017 | Cheng et al. | |
| 9,748,380 B1 | | 8/2017 | Lie et al. | |
| 9,780,218 B1 * | | 10/2017 | Liu | H01L 29/0649 |
| 9,805,942 B2 | | 10/2017 | Kim et al. | |
| 9,831,116 B2 * | | 11/2017 | Lee | H01L 21/764 |
| 9,859,403 B1 * | | 1/2018 | Breil | H01L 29/045 |
| 9,882,054 B2 * | | 1/2018 | Liou | H01L 21/76897 |
| 9,941,368 B2 | | 4/2018 | Lu et al. | |
| 10,014,224 B2 | | 7/2018 | Jangjian et al. | |
| 10,164,098 B2 * | | 12/2018 | Huang | H01L 29/0847 |
| 10,297,601 B2 * | | 5/2019 | Kim | H01L 29/66545 |
| 10,453,943 B2 | | 10/2019 | Lin et al. | |
| 10,483,377 B2 * | | 11/2019 | Zang | H01L 29/7848 |
| 2011/0193141 A1 | | 8/2011 | Lin et al. | |
| 2011/0210404 A1 | | 9/2011 | Su et al. | |
| 2011/0298058 A1 * | | 12/2011 | Kawasaki | H01L 29/66795 257/401 |
| 2012/0091538 A1 | | 4/2012 | Lin et al. | |
| 2013/0089959 A1 | | 4/2013 | Kwok et al. | |
| 2013/0175584 A1 * | | 7/2013 | Ho | H01L 29/0847 257/288 |
| 2013/0328126 A1 | | 12/2013 | Tsai et al. | |
| 2014/0065782 A1 | | 3/2014 | Lu et al. | |
| 2014/0134818 A1 | | 5/2014 | Cheng et al. | |
| 2014/0183605 A1 * | | 7/2014 | Mochizuki | H01L 29/785 257/288 |
| 2014/0203370 A1 | | 7/2014 | Maeda et al. | |
| 2014/0299934 A1 | | 10/2014 | Kim et al. | |
| 2015/0187914 A1 | | 7/2015 | Basket et al. | |
| 2015/0214369 A1 * | | 7/2015 | Fronheiser | H01L 29/16 257/192 |
| 2015/0318399 A1 | | 11/2015 | Jeong et al. | |
| 2015/0340471 A1 * | | 11/2015 | Lim | H01L 29/0847 438/283 |
| 2016/0005738 A1 | | 1/2016 | Liu et al. | |
| 2016/0013297 A1 | | 1/2016 | Lu et al. | |
| 2016/0099352 A1 * | | 4/2016 | Lee | H01L 27/0924 257/192 |
| 2016/0155838 A1 | | 6/2016 | Kim et al. | |
| 2016/0190017 A1 * | | 6/2016 | Lee | H01L 21/0262 257/192 |
| 2016/0211338 A1 | | 7/2016 | Wang et al. | |
| 2016/0211352 A1 * | | 7/2016 | Chuang | H01L 29/045 |
| 2016/0211372 A1 | | 7/2016 | Yu et al. | |
| 2016/0225904 A1 * | | 8/2016 | Liao | H01L 29/7851 |
| 2016/0315081 A1 * | | 10/2016 | Park | H01L 29/0847 |
| 2016/0315146 A1 | | 10/2016 | Jung et al. | |
| 2016/0372580 A1 | | 12/2016 | Ching et al. | |
| 2017/0053912 A1 | | 2/2017 | Ching et al. | |
| 2017/0077222 A1 | | 3/2017 | Lee et al. | |
| 2017/0077229 A1 * | | 3/2017 | Hsu | H01L 27/0924 |
| 2017/0125410 A1 | | 5/2017 | Li et al. | |
| 2017/0140996 A1 * | | 5/2017 | Lin | H01L 29/785 |
| 2017/0141221 A1 * | | 5/2017 | Liou | H01L 21/0262 |
| 2017/0221890 A1 * | | 8/2017 | Wang | H01L 21/823418 |
| 2018/0047833 A1 | | 2/2018 | Lee et al. | |
| 2018/0082883 A1 | | 3/2018 | Lee et al. | |
| 2018/0097089 A1 | | 4/2018 | Zang et al. | |
| 2018/0145173 A1 | | 5/2018 | Chang et al. | |

FOREIGN PATENT DOCUMENTS

| | | |
|---|---|---|
| CN | 103811351 A | 5/2014 |
| CN | 105304709 A | 2/2016 |
| CN | 106158969 A | 11/2016 |
| KR | 1020110098594 A | 9/2011 |
| KR | 1020160005550 A | 1/2016 |
| KR | 1020160088220 | 7/2016 |
| KR | 20180060949 A | 6/2018 |
| KR | 20190099385 A | 8/2019 |

* cited by examiner

FINFET HAVING A NON-FACETED TOP SURFACE PORTION FOR A SOURCE/DRAIN REGION

This application is a divisional of U.S. patent application Ser. No. 15/640,645, filed on Jul. 3, 2017, entitled "FETS and Methods of Forming FETS," which claims priority to U.S. Provisional Application No. 62/427,599, filed Nov. 29, 2016, entitled "FETS and Methods of Forming FETS," which patent applications are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
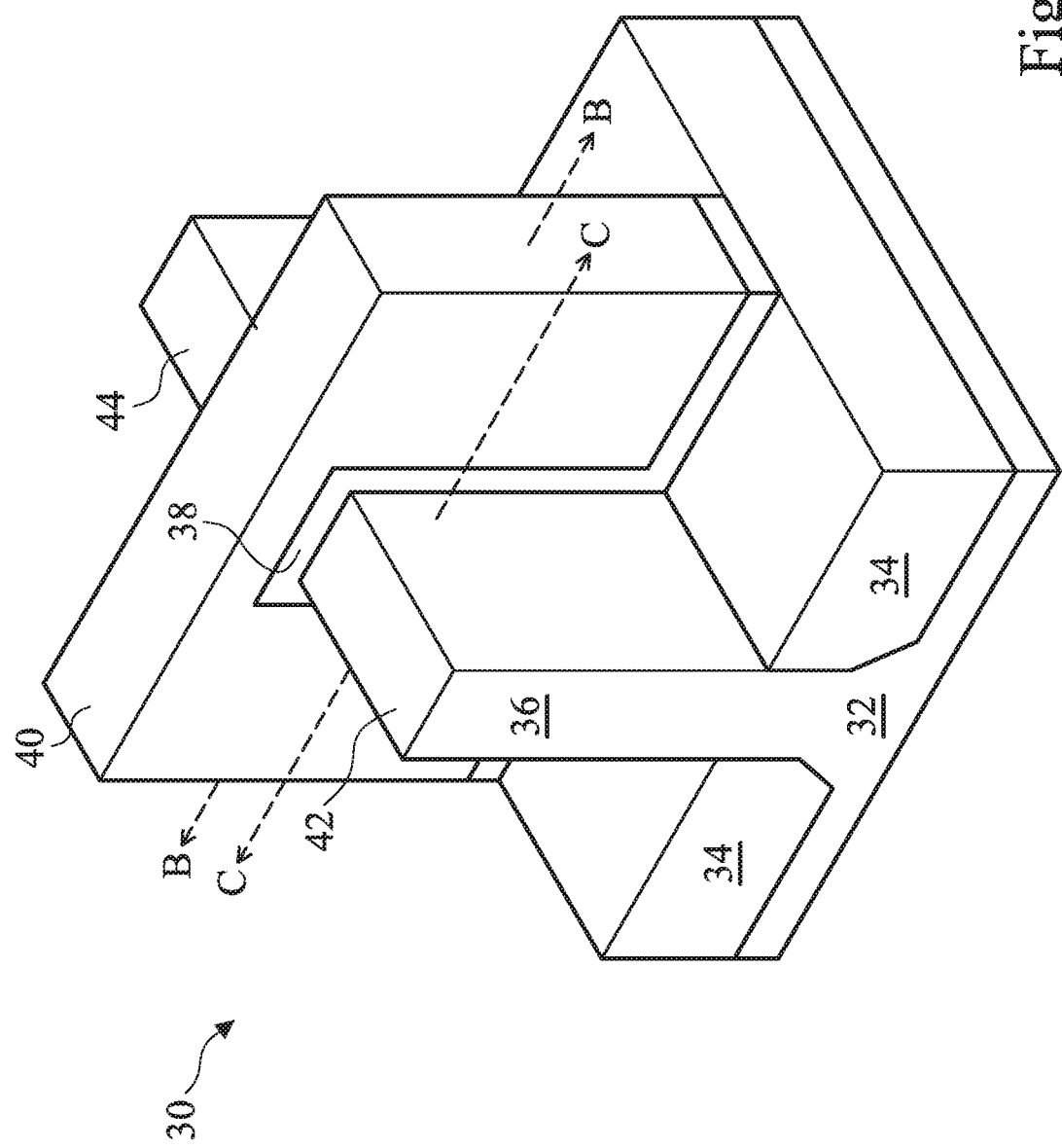
FIG. 1 is an example of a Fin Field-Effect Transistor (FinFET) in a three -dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-first process. In other embodiments, a gate-last process (sometimes referred to as replacement gate process) may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a process flow to achieve a non-faceted top surface for an epitaxial source/drain in a FinFET, for device enhancement. In addition, this non-faceted top surface epitaxial source/drain fills the intra-fin area near the top of the fins with the epitaxial source/drain material which increases the contact landing area and can reduce the contact resistance to the source/drain region.

The process flow includes a first deposition process followed by a first etch back process followed by a second deposition process and a second etch back process. Each of the deposition processes can include silane ($SiH_4$) and phosphine ($PH_3$) precursors for growing, for example, silicon phosphorous (SiP) source/drain regions. Each of the etch back processes are performed in high temperature and low pressure environments and may include both $SiH_4$ and hydrochloric acid (HCl) as a precursor. In some embodiments, the etch back processes do not include SiH4 as a precursor. The high temperature for the etch back processes may be in a range from about 650° C. to about 800° C. The low pressure for the etch back processes may be in a range from 1 torr to about 50 torr. By having the environment for the etch back processes be high temperature and low pressure, the shape of the source/drain can be controlled to not have a faceted top surface as the $SiH_4$ will passivate the top surfaces (100 orientation) while the HCl will etch the sides (110 orientation) of the source/drain regions from about 1 to about 20 times, such as about 4 times the rate of the top surfaces of the source/drain regions. A facet is a surface that is not parallel and not perpendicular to a top surface of the substrate. In some embodiments, the disclosed process flow can be used in the formation of static random access memory (SRAM) devices.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section B-B is across a channel, gate dielectric 38, and gate electrode 40 of the FinFET 30. Cross-section C-C is parallel to cross-section B-B and is across a source/drain region 42. Subsequent figures refer to these reference cross-sections for clarity.

FIGS. 2 through 15 are three dimensional and cross-sectional views of intermediate stages in the manufacturing of FinFETs in accordance with some embodiments. FIGS. 2 through 15 illustrate a FinFET similar to FinFET 30 in FIG. 1, except for multiple fins on a crown structure. FIGS. 2 through 6 illustrated cross -section B-B. In FIGS. 7A through 8C, figures ending with an "A" designation are three-dimensional views; figures ending with a "B" designation illustrate cross-section B-B; and figures ending with a "C" designation illustrate cross-section C-C. FIGS. 9 through 15 illustrate cross-section C-C.

Figure 2:
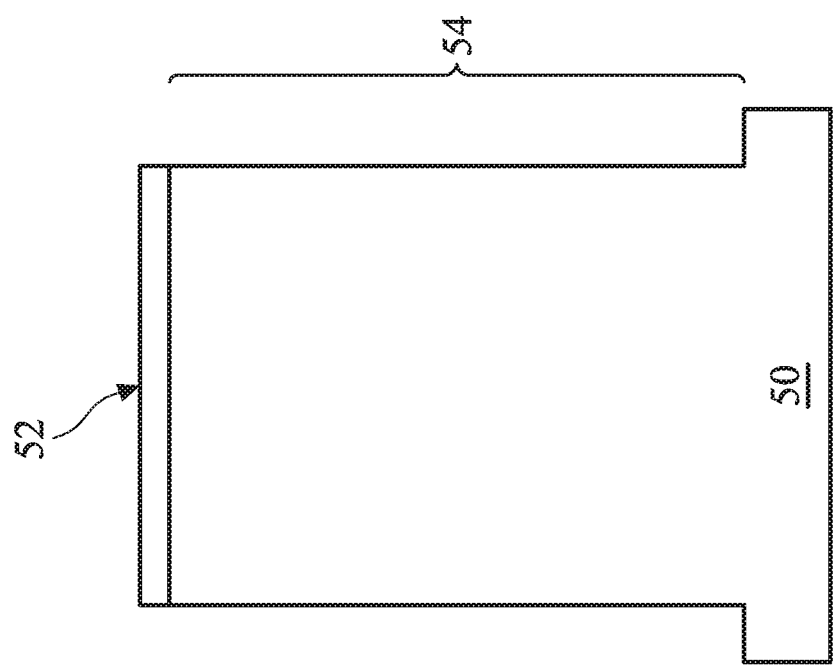
FIGS. 2 through 6, 7A-7C, 8A-8C, and 9 through 15 are three-dimensional and cross-sectional views of intermediate stages in the manufacturing of FinFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

FIG. 2 further illustrates the formation of a mask layer 52 over the substrate and the patterning of the substrate 50 using the mask layer 52 to form a patterned portion 54 of the substrate 50. In some embodiments, the mask layer 52 is a hard mask and may be referred to as hard mask 52 hereinafter. The hard mask 52 may be formed of silicon nitride, silicon oxynitride, silicon carbide, silicon carbonitride, the like, or a combination thereof.

In some embodiments, the patterned portion 54 of the substrate 50 may be formed by etching the substrate 50 that lies outside of the patterned mask layer 52. The etching may be any acceptable etch process, such as a reactive ion etch (RIE), neutral beam etch (NBE), the like, or a combination thereof. The etch may be anisotropic.

Figure 3:
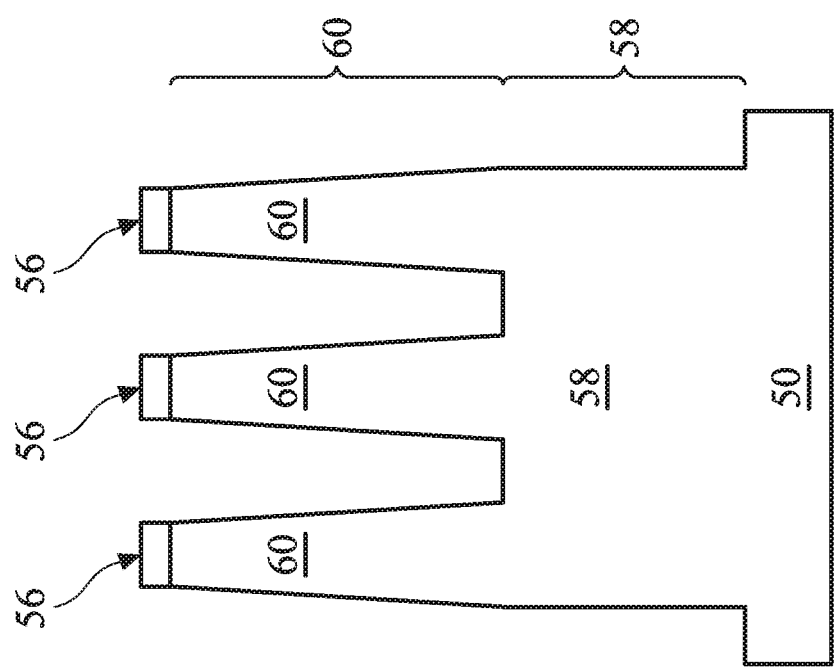

FIG. 3 illustrate the formation of a crown structure 58 and semiconductor strips 60 over the crown structure 58. A mask layer 56 may be formed and patterned over the patterned portion 54 of the substrate 50. In some embodiments, the mask layer 56 is a hard mask and may be referred to as hard mask 56 hereinafter. The hard mask 56 may be formed of silicon nitride, silicon oxynitride, silicon carbide, silicon carbonitride, the like, or a combination thereof.

In some embodiments, the crown structure 58 and the semiconductor strips 60 may be formed by etching trenches in the hard mask 56 and the patterned portion 54 of the substrate 50. The semiconductor strips 60 may also be referred to as semiconductor fins 60. The etching may be any acceptable etch process, such as a RIE, NBE, the like, or a combination thereof. The etch may be anisotropic.

Figure 4:
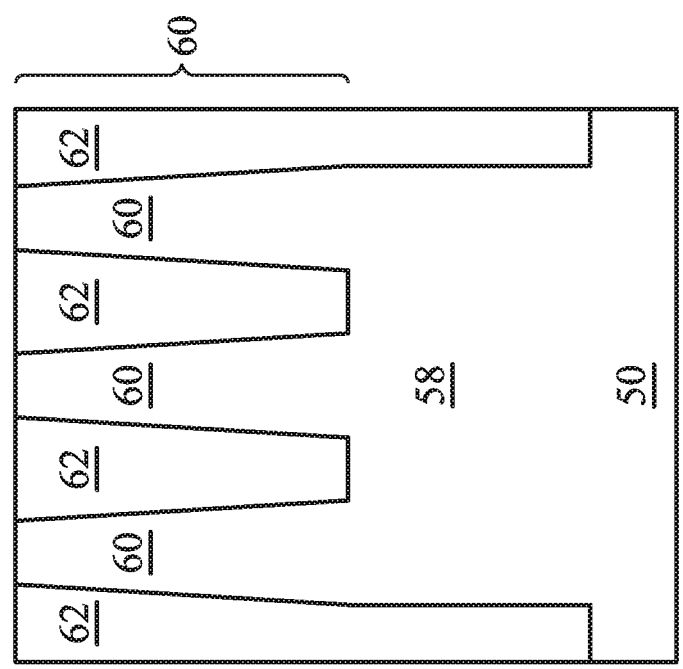

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP -CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4, a planarization process, such as a chemical mechanical polish (CMP), may remove any excess insulation material (and, if present, the hard mask 56) and form top surfaces of the isolation regions 62 and top surfaces of the semiconductor strips 60 that are coplanar within process variations.

Figure 5:
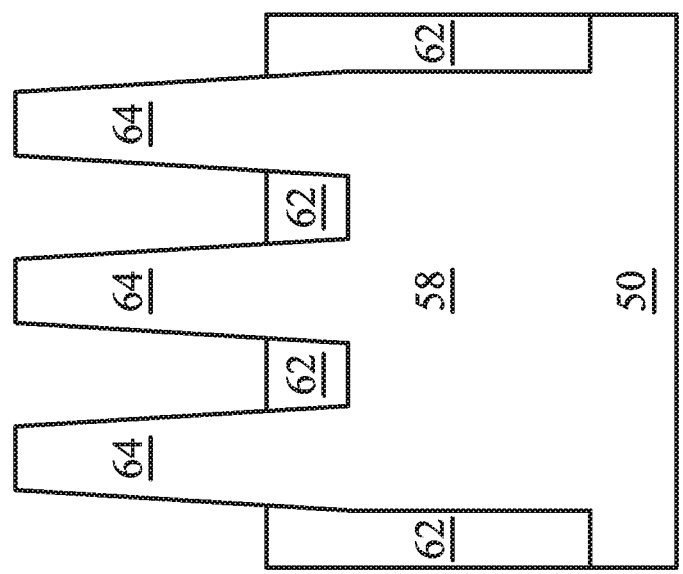

FIG. 5 illustrates the recessing of the isolation regions 62, such as to form shallow trench isolation (STI) regions. The isolation regions 62 are recessed such that the upper portions of the semiconductor strips 60 protrude from between neighboring isolation regions 62 and form semiconductor fins 64. As illustrated some portions of the isolation regions 62 remains on top of the crown structure 58 between the adjacent semiconductor fins 64. Further, the top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 6:
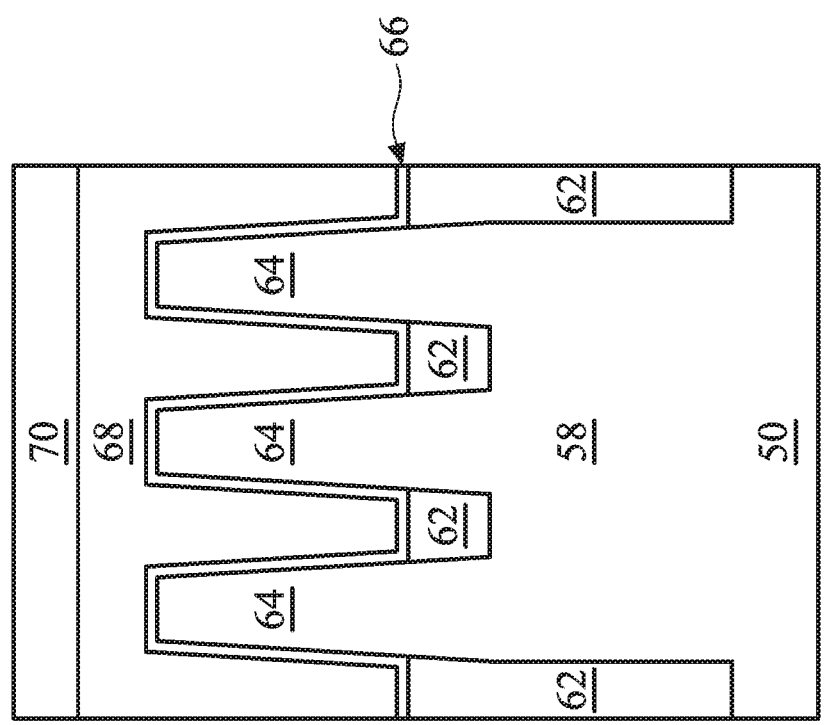

FIG. 6 illustrates the formation of a gate structure over the semiconductor fins 64. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate electrode 68 and gate dielectric 66. The gate electrode 68 and gate dielectric 66 cover respective channel regions of the semiconductor fins 64. The gate electrode 68 may also have a lengthwise direction perpendicular, within process variation and alignment, to the lengthwise direction of respective semiconductor fins 64.

Figure 7A:
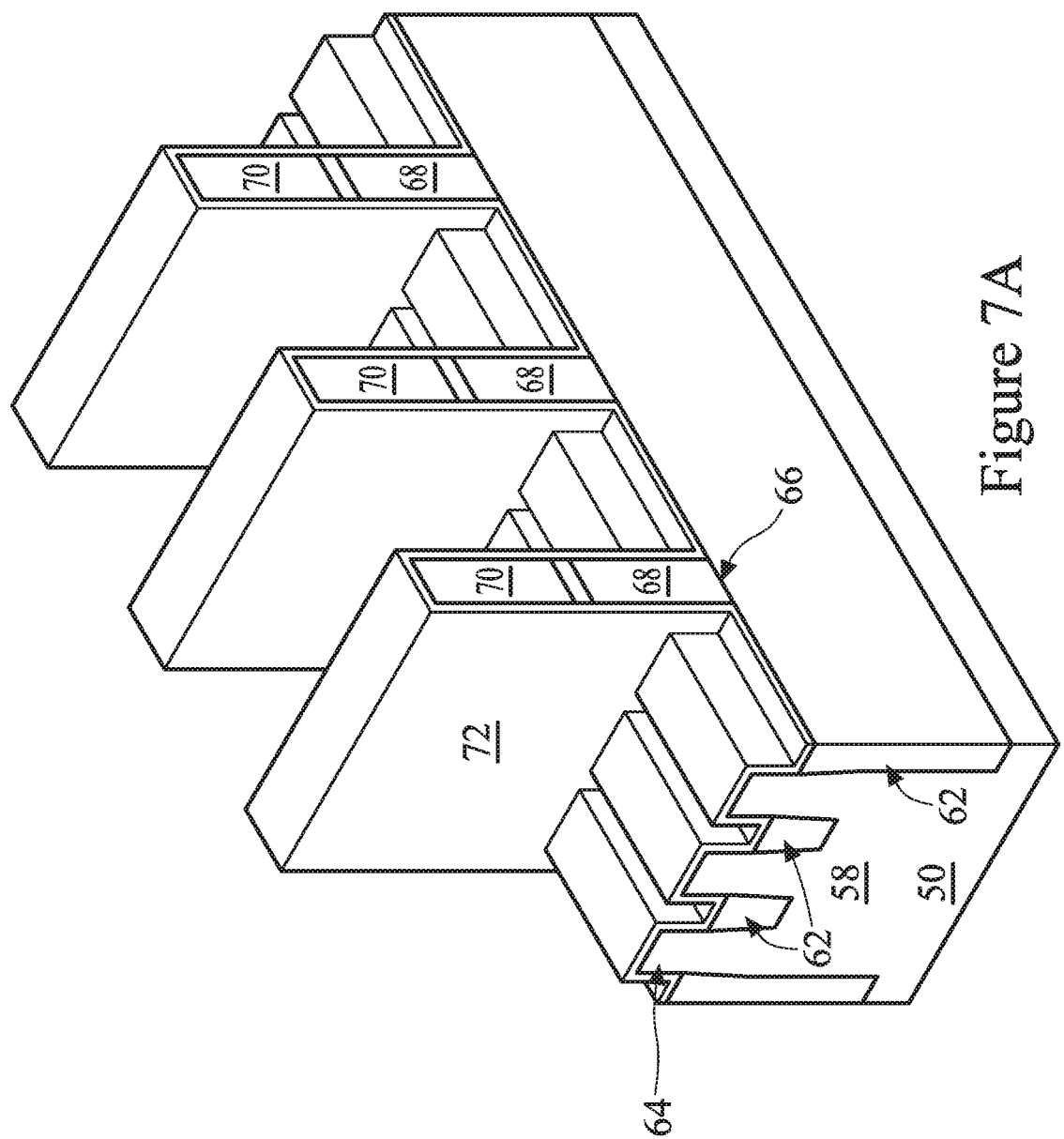
Figure 7B:
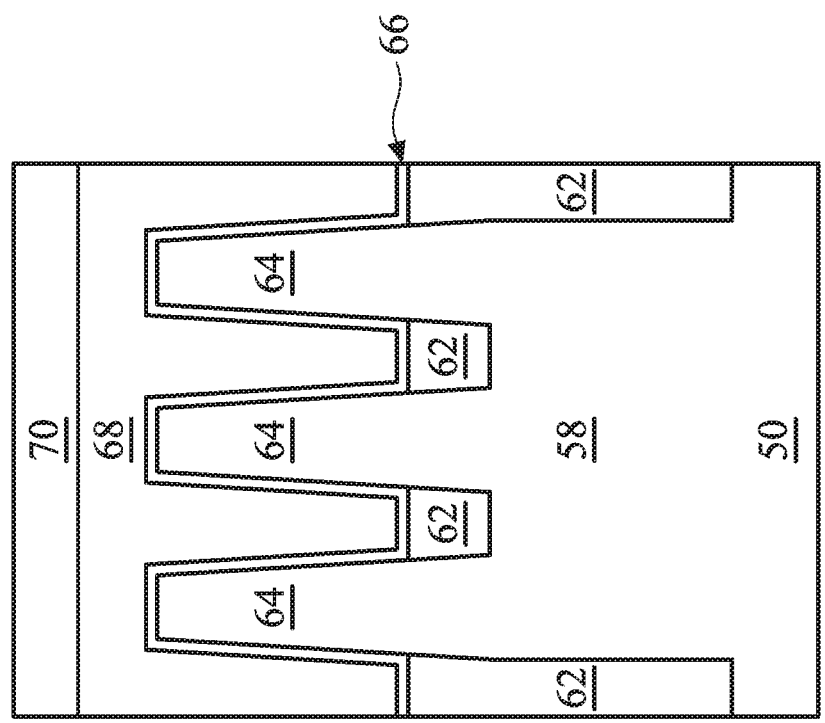
Figure 7C:
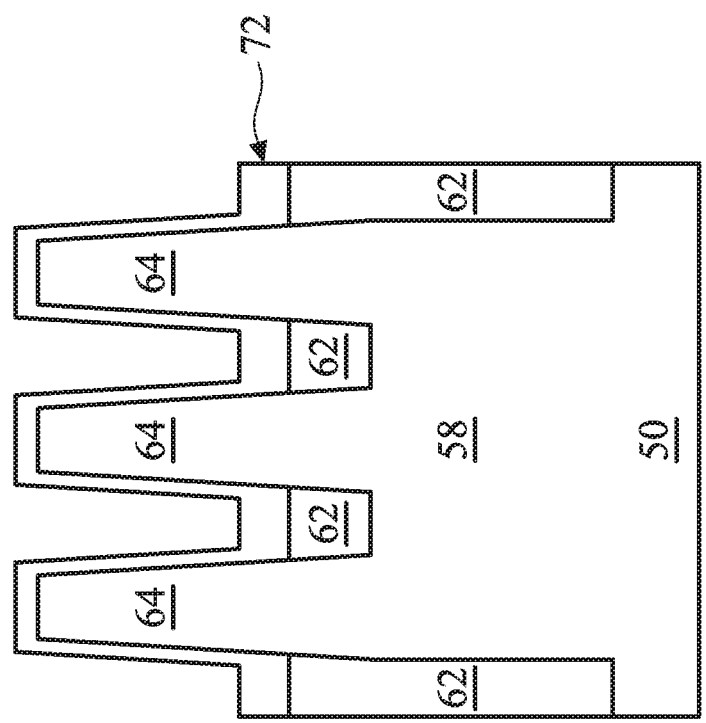

FIGS. 7A, 7B, and 7C illustrate the formation of gate seal spacers 72 on exposed surfaces of isolation regions 62, semiconductor fins 64, gate electrode 68, and mask 70. A thermal oxidation or a deposition process may form the gate seal spacers 72. In some embodiments, the gate seal spacers 72 may be formed of a nitride, such as silicon nitride, silicon oxynitride, silicon carbide, silicon carbonitride, the like, or a combination thereof. The formation of the gate seal spacers 72 may be followed by an anisotropic etch process, such as a dry etch process, to remove portions of the gate seal spacers 72 outside of the sidewalls of the gate structures. In some embodiments, after the etch process, some portions of the gate seal spacers 72 remains on the isolation regions 62 between the adjacent semiconductor fins 64.

Figure 8A:
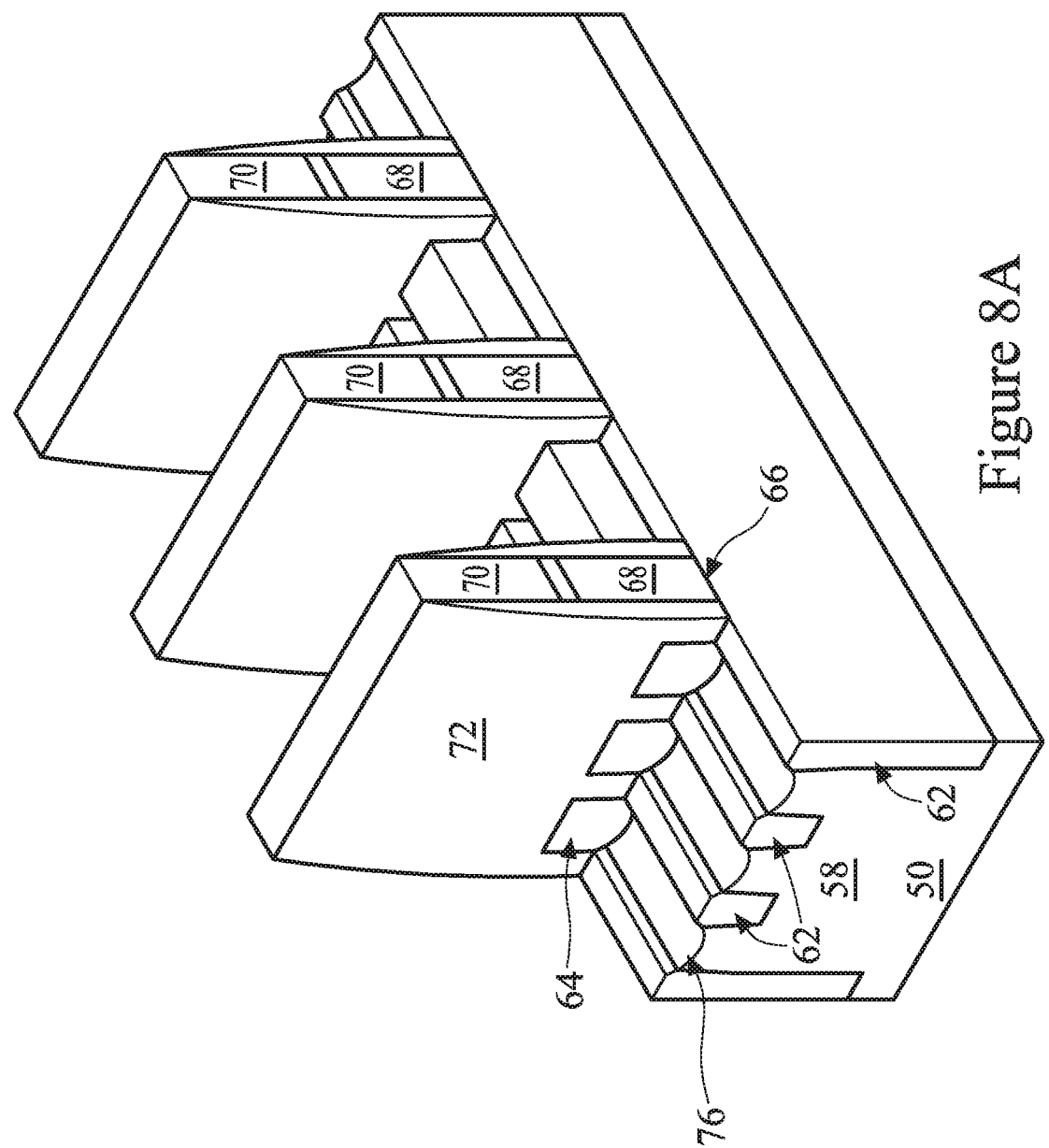
Figure 8B:
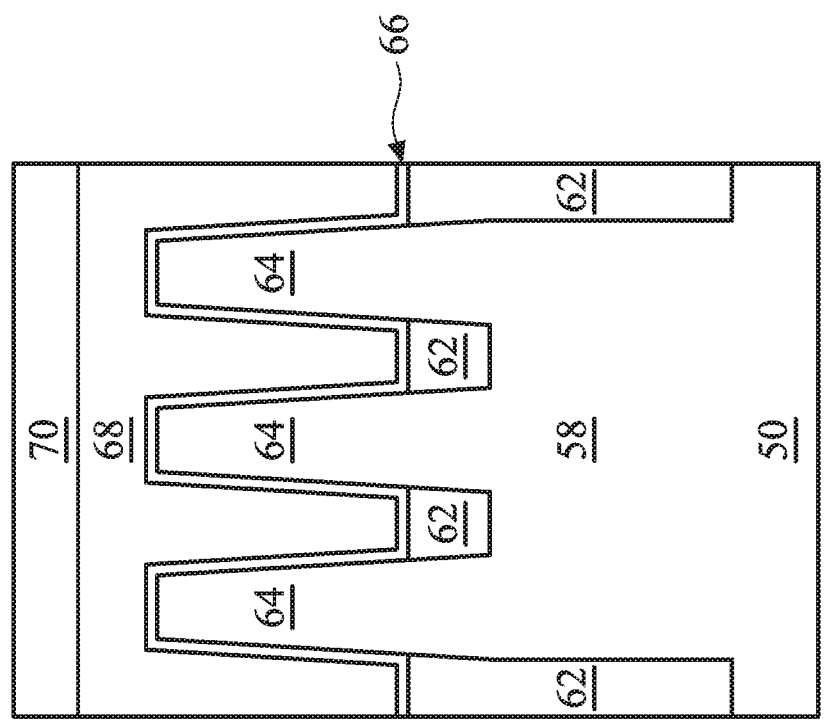
Figure 8C:
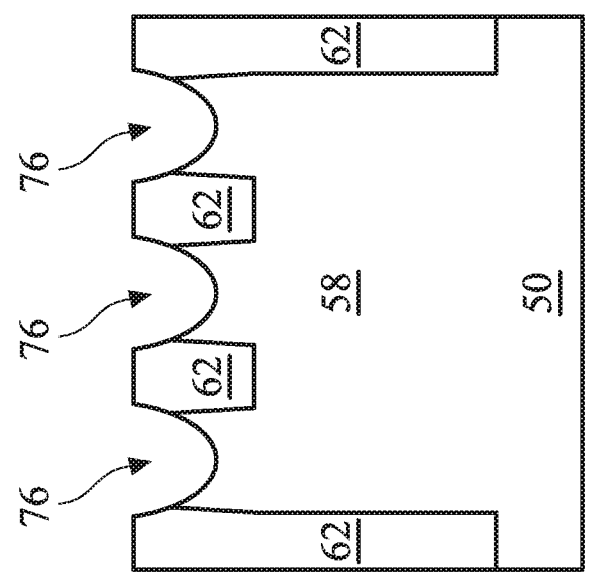

FIGS. 8A, 8B, and 8C illustrate the removal the semiconductor fins 64 outside of the gate structure. The gate structure may be used as a mask during the removal of the semiconductor fins 64 and such that recesses 76 are formed in the semiconductor fins 64 and/or isolation regions 62. As illustrated, after the removal of the semiconductor fins 64, at least a portion of the isolation regions 62 remains on the top surface of the crown structure 58 between the adjacent semiconductor fins 64.

The recesses 76 may be formed by etching using any acceptable etch process, such as a RIE, NBE, tetramethylammonium hydroxide (TMAH), ammonium hydroxide (NH$_4$OH), a wet etchant capable of etching silicon with good etch selectivity between silicon and a material of the isolation regions 62 and/or the gate seal spacers 72, the like, or a combination thereof. The etch may be anisotropic. In some embodiments, the top surface of the crown structure 58 is exposed as at least portions of the bottom surfaces of the recesses 76. In some embodiments, a portion of the gate seal spacer material 72 remains on the isolation regions 62 between the adjacent semiconductor fins 64 (not shown in Figures).

Figure 9:
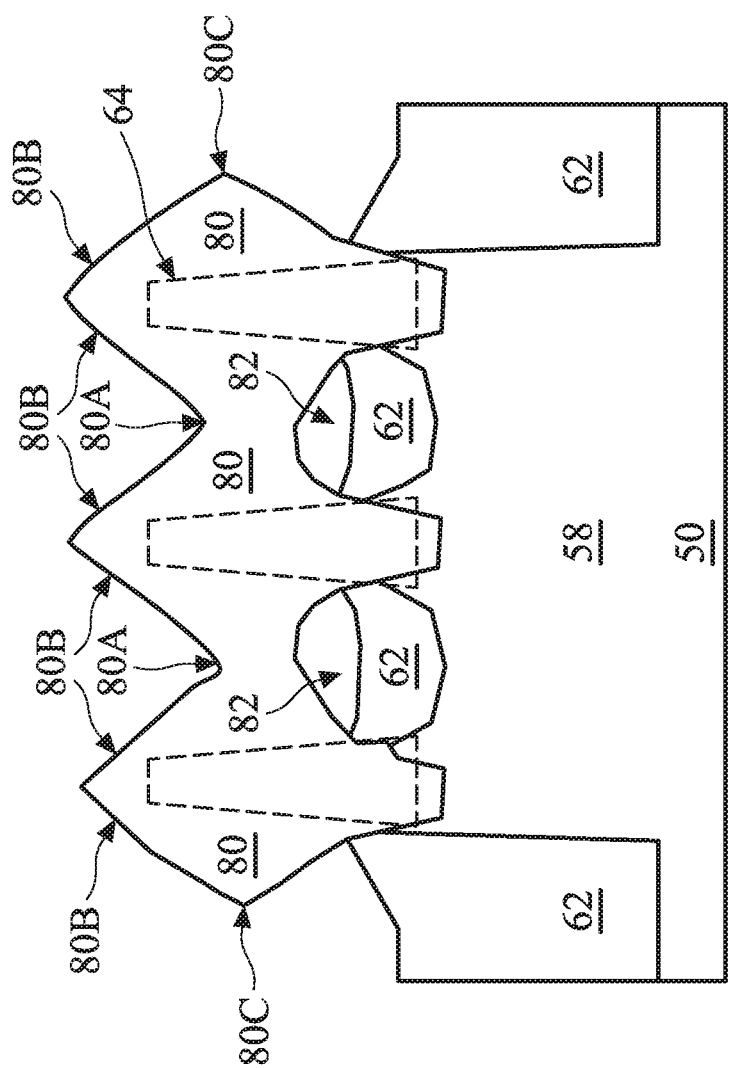

FIGS. 9 through 13 illustrate the formation of the source/drain regions. In some embodiments, the source/drain regions comprise multiple, distinct deposition and etch back processes. As illustrated in FIG. 9, a first deposition process is performed to form epitaxial layer 80 in the recesses 76 by epitaxially growing a material in the recesses 76, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 9, due to the blocking of the isolation regions 62 between the adjacent semiconductor fins 64, the epitaxial layer 80 first grows vertically in recesses 76, during which time the epitaxial layer does not grow horizontally. After recesses 76 are fully filled, the epitaxial layer 80 grows both vertically and horizontally to form facets. The location of the fins 64 in the channel region under the gate (e.g. not recessed by prior etching step to form the recesses 76) are shown for reference.

In some exemplary embodiments in which the resulting FinFET is an n-type FinFET, the first epitaxial layer 80 comprises silicon carbide (SiC), silicon phosphorous (SiP), phosphorous-doped silicon carbon (SiCP), or the like. In alternative exemplary embodiments in which the resulting FinFET is a p-type FinFET, the first epitaxial layer 80 comprises SiGe, and a p-type impurity such as boron or indium.

The first epitaxial layer 80 may be implanted with dopants followed by an anneal. The implanting process may include forming and patterning masks such as a photoresist to cover the regions of the FinFET that are to be protected from the implanting process. The first epitaxial layer 80 may have an impurity concentration in a range from about $3e^{21}$ cm$^{-3}$ to about $4.2e^{21}$ cm$^{-3}$. In some embodiments, the first epitaxial layer 80 may be in situ doped during growth.

As illustrated in FIG. 9, the first epitaxial layer 80 of the adjacent semiconductor fins merge to form a continuous epitaxial layer 80. Due to the blocking of the isolation regions 62 on the crown structure 58, air gaps 82 are formed between the lower portions of the first epitaxial layer 80 and the top surface of the isolation regions 62 on the crown structure 58. After the first deposition process, the first epitaxial layer 80 has surfaces with various crystalline orientations. For example, first portions 80A of the top surface of the first epitaxial layer 80 has (100) crystalline orientations. These first portions 80A are between second portions 80B of the top surface, which are facets that have (111) crystalline orientations. The faceted second portions 80B of the top surface of source/drain regions 80 form between adjacent fins 64 (intra-fin area) such that the top surface of the source/drain regions 80 in the intra-fin area is below a top surface of the fins 64. The first epitaxial layer 80 also has third portions 80C, which are on the sides of the first epitaxial layer 80 and have (110) crystalline orientations.

Figure 10:
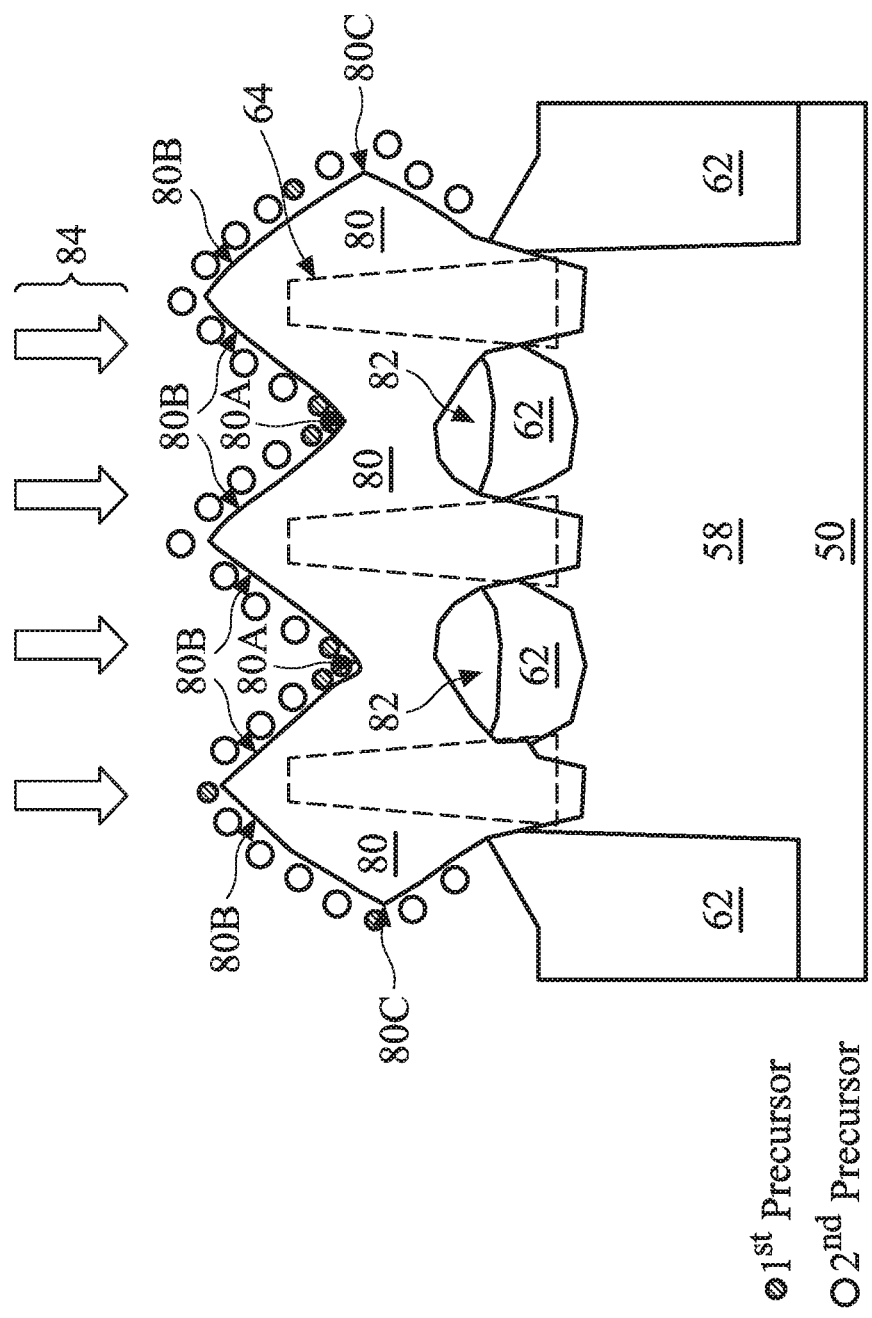

In FIG. 10, a first etch back process 84 is performed on the first epitaxial layer 80. The first etch back process 84 may include multiple gases/precursors. In some embodiments, the first etch back process 84 includes two precursors, SiH$_4$ and HC. In an embodiment, the amount of the SiH$_4$ precursor as a percentage of both of the precursors is in a range from about 5% to about 20%. In an embodiment, the amount of the HCl precursor as a percentage of both of the precursors is in a range from about 10% to about 45%. In these embodiments, the SiH$_4$ (illustrated as the 1$^{st}$ precursor in FIG. 10) covers and passivates the first portions 80A of the top surface of the first epitaxial layer 80, which is a (100) crystalline orientation. Also, in these embodiments, the HCl (illustrated as the 2$^{nd}$ precursor in FIG. 10) attacks and etches the second and third portions 80B and 80C.

The first etch back process 84 is performed in a high temperature and low pressure environment. The high temperature for the first etch back process 84 may be in a range from about 650° C. to about 800° C. The low pressure for the first etch back process 84 may be in a range from 1 torr to about 50 torr. In some embodiments, the first etch back process may include H$_2$ as a carrier gas and may have an etching time in a range from about 50 seconds to about 700 seconds. By having the environment for the etch back processes be high temperature and low pressure, the shape of the first epitaxial layer 80 can be controlled to have non-faceted tops as the SiH$_4$ will passivate and protect the top surfaces (100 orientation) while the HCl precursor will attack and etch the sides (80C) (110 orientation) and faceted top surface (80B) (111 orientation) faster than the top surface (80A) (100 orientation) of the first epitaxial layer 80. For example, the HCl will etch the sides (110 orientation) of the first epitaxial layer 80 from about 1 to about 20 times, such as about 4 times the rate of the top surface of the first epitaxial layer 80. Although HCl is used as the etchant above, other etchants, such as GeH$_4$ and/or Cl$_2$ may also be used for the controlled etch process to achieve the non-faceted top surfaces of the first epitaxial layer. In some embodiments, the non-faceted top surface is substantially level.

Figure 11:
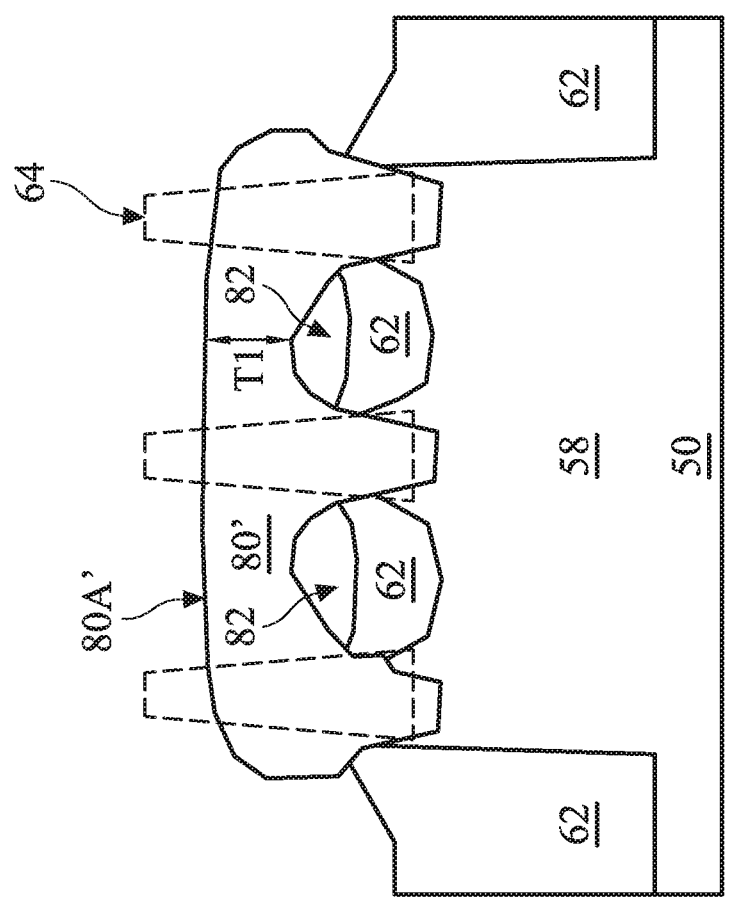

FIG. 11 illustrates the first epitaxial layer 80' after the first etch back process 84 is performed. The etched back top surface 80A' of the first epitaxial layer 80' is a (100) crystalline orientation. In some embodiments, the intra-fin thickness of the etched back first epitaxial layer 80' may have a thickness T1 of about 10 nm. In some embodiments, the first etch back process 84 removes the faceted portions 80B of the top surface to leave a top surface 80A' that is lower than the top surface of the fins 64 in both the fin and intra-fin areas.

Figure 12:
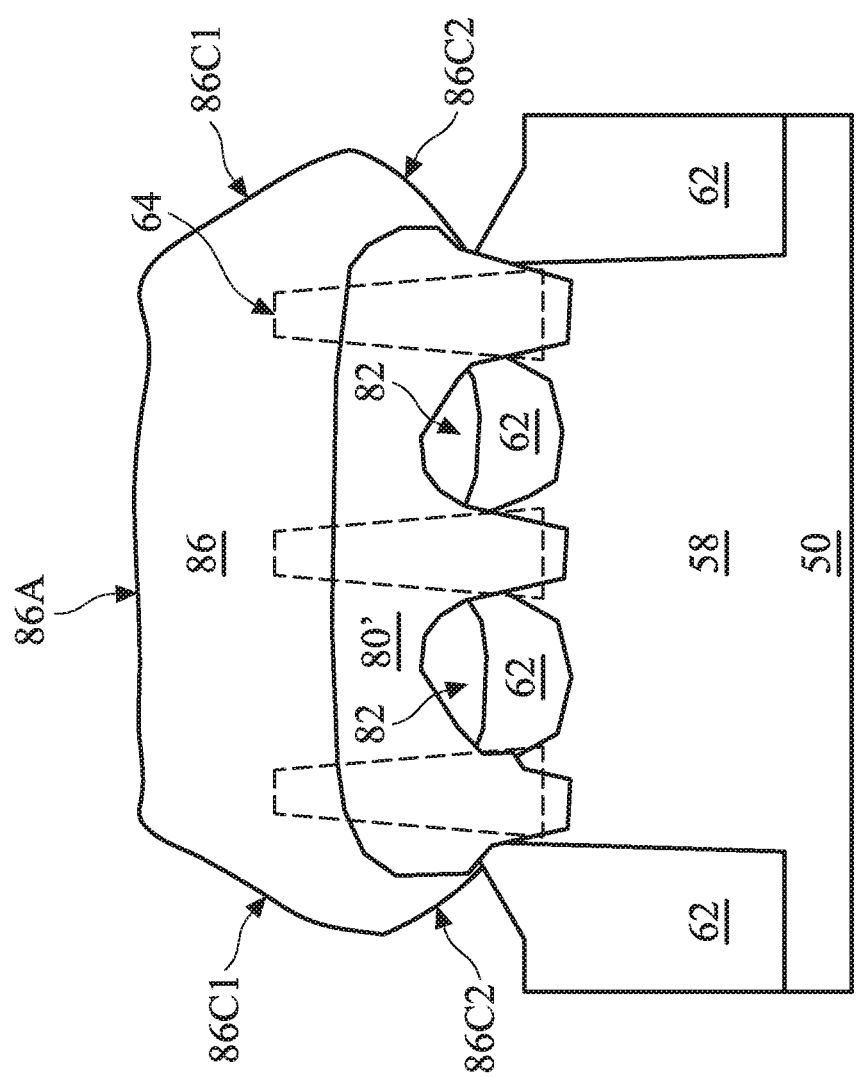

FIG. 12 illustrates the second deposition process to form a second epitaxial layer 86 on the etched back first epitaxial layer 80'. The second deposition process is performed to form epitaxial layer 86 with top surface 86A and sides 86C on the etched back first epitaxial layer 80' by epitaxially growing a material, such as MOCVD, MBE, LPE, VPE, SEG, the like, or a combination thereof. As illustrated in FIG. 12, the second epitaxial layer 86 grows both vertically and horizontally to form facets on the sides 86C with the top surface 86A of the source/drain regions across the entire intra-fin area higher than the fins 64 such that the second epitaxial layer 86 fills the intra-fin area between adjacent fins. The sides 86C include facets 86C1 and 86C2 that are on different planes. The facet 86C1 extends down from the top surface 86A and meets the facet 86C2 with both facets being non-parallel and non-perpendicular to a major surface of the substrate 50.

In some exemplary embodiments in which the resulting FinFET is an n-type FinFET, the second epitaxial layer 86 comprises SiC, SiP, SiCP, or the like. In alternative exemplary embodiments in which the resulting FinFET is a p-type FinFET, the second epitaxial layer 86 comprises SiGe, and a p-type impurity such as boron or indium.

The second epitaxial layer 86 may be implanted with dopants followed by an anneal. The implanting process may include forming and patterning masks such as a photoresist to cover the regions of the FinFET that are to be protected from the implanting process. The second epitaxial layer 86 may have an impurity concentration in a range from about $3e^{21}$ cm$^{-3}$ to about $4.2e^{21}$ cm$^{-3}$. In some embodiments, the second epitaxial layer 86 may be in situ doped during growth.

Figure 13:
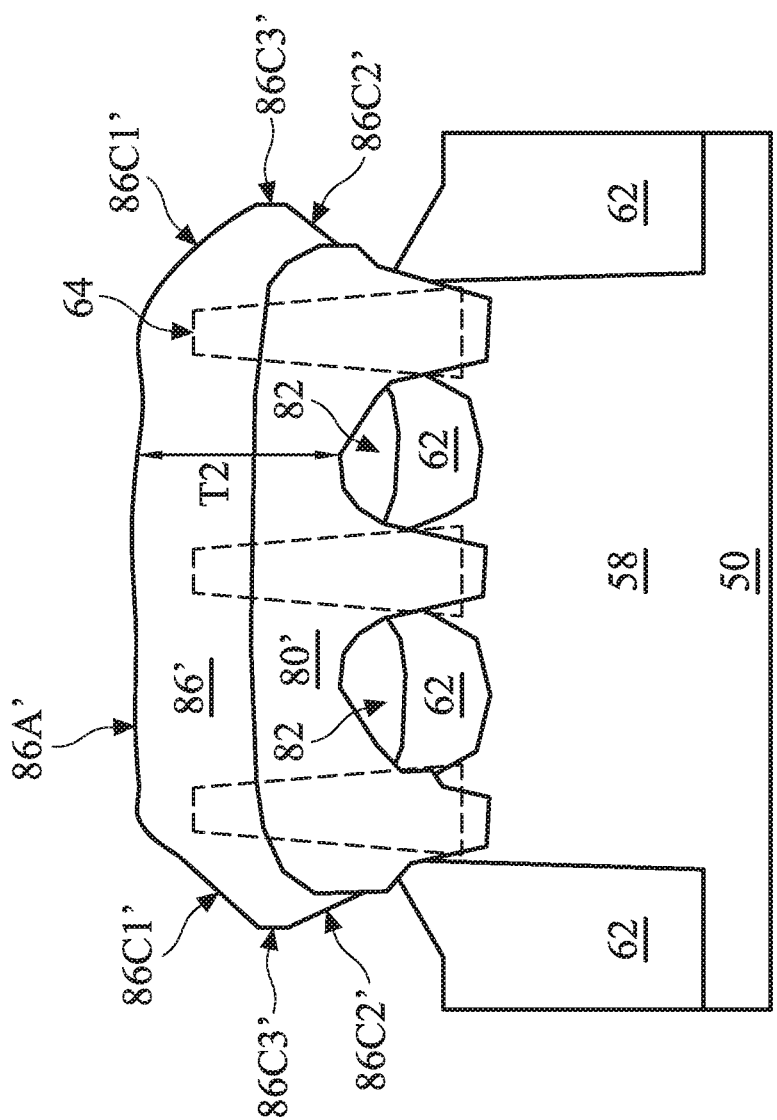

FIG. 13 illustrates the second epitaxial layer 86' after a second etch back process with the etched back epitaxial layers 86' and 80' forming source/drain regions 86'/80'. The second etch back process is similar to the first etch back process described above and enables the second epitaxial layer 86' to have a top surface 86A' higher than the fins 64 in both the fin and intra-fin areas such that the second epitaxial layer 86 fills the intra-fin area between adjacent fins 64. In particular, the top surface 86A' of the etched back second epitaxial layer 86' can be higher than the fins 64 across the entire intra-fin area. The second etch back process may include multiple gases/precursors. In some embodiments, the second etch back process includes two precursors, SiH$_4$ and HCl. Further, after the second etch back process, the etched back second epitaxial layer 86' can have side facets 86C3' on the sides due to the faster etch rate for the (110 orientation) surface of the sides as compared to the etch rate of the top surface 86A' (100 orientation) of the second epitaxial layer 86. The facets 86C3' are between the facets 86C1' and 86C2'. In some embodiments, the facets 86C3' are substantially perpendicular to a major surface of the substrate. As discussed above for the first etch back process, the SiH$_4$ precursor will passivate and protect the top surfaces 86A (100 orientation) while the HCl precursor will attack and etch the sides (86C) (110 orientation). In some embodiments, the intra-fin thickness of the combined etched back first and second epitaxial layer 80'/86' may have a thickness T2 of greater than about 10 nm. In some embodiments, the thickness T2 may be twice as thick as thickness T1, such as greater than about 20 nm.

The second etch back process is performed in a high temperature and low pressure environment. The high temperature for the second etch back process may be in a range from about 650° C. to about 800° C. The low pressure for the second etch back process may be in a range from 1 torr to about 50 torr. In some embodiments, the second etch back process may include H$_2$ as a carrier gas and may have a etching time in a range from about 50 seconds to about 700 seconds. By having the environment for the etch back processes be high temperature and low pressure, the shape of the source/drain regions 86'/80' can be controlled to have non-faceted tops 86A' such that the epitaxial source/drain material fills the intra-fin area. While the top surface of the source/drain regions 86'/80' are not faceted, the lower surfaces (e.g. surfaces exposed to the air gaps 82) are faceted surfaces.

After the formation of the source/drain regions 86'/80', a capping layer (not shown) may formed on the source/drain regions 86'/80'. The capping layer may be considered part of the source/drain regions 86'/80'. In some embodiments, the capping layer is epitaxially grown on the source/drain regions 86'/80'. The capping layer helps to protect the source/drain regions 86'/80' from dopant loss during the subsequent processing (e.g. etching processes, temperature processing, etc.).

The epitaxial source/drain regions 86'/80' can extend into the crown structure 58. This portion of the source/drain regions 86'/80' that extends into the crown structure 58 may be referred to as a buffer layer (not shown) as it buffers the strain differences between the higher dopant concentration source/drain regions 86'/80' above it and the crown structure 58 below it. The buffer layer may be considered part of the source/drain regions 86'/80'. The dopant concentration of the buffer layer and the rest (i.e. portion of source/drain regions 86'/80' not considered part of the buffer layer, e.g., portion of the source/drain regions 86'/80' above the top surface of the crown structure 58) of the source/drain regions 86'/80' can be different. For example, the buffer layer can have a lower concentration of phosphorous than the rest of the source/drain regions 86'/80'. The higher concentration of the rest of the source/drain regions 86'/80' allows for the source/drain regions 86'/80' to apply greater stress to the channel region of the FinFET. This high dopant concentration portion of the source/drain regions 86'/80' may be referred to a stressor layer 86'/80'. In addition, the dopant concentration of the capping layer and the stressor layer 86'/80' can be different.

In some embodiments, the buffer layer and the first epitaxial layer 80 can be formed in a single, continuous epitaxial process. In other embodiments, these structures may be formed in separate processes. In the embodiment with the single, continuous process, the processing parameters of the epitaxial process (e.g. process gas flow, temperature, pressure, etc.) can be varied to form these structures with the varying material compositions. For example, during the epitaxy, the flow rate of the precursors may be at a first level during the formation of the buffer layer and may be increased to a second level when transitioning to the formation of the first epitaxial layer 80.

Subsequent processing of the FinFET device may be performed, such as the formation of one or more interlayer dielectrics and formation of contacts. These processes will be discussed below in reference to FIGS. 14 and 15.

Figure 14:
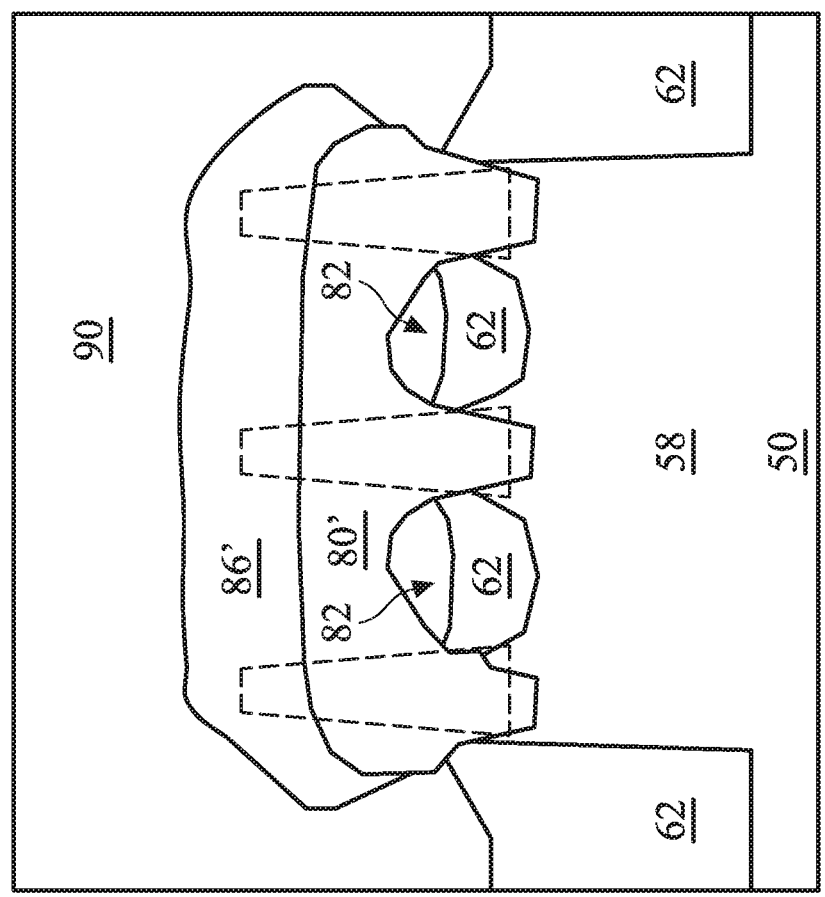

In FIG. 14, an interlayer dielectric (ILD) 90 is deposited over the structure illustrated in FIG. 13. The ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 15:
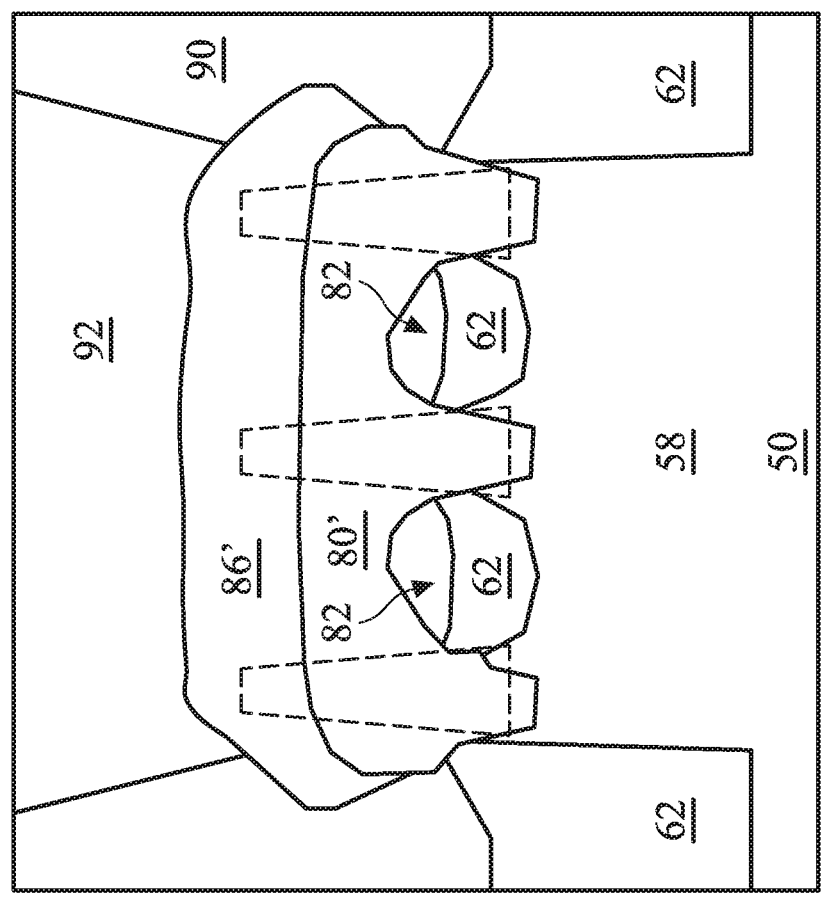

In FIG. 15, a contact 92 is formed through ILD 90. The opening for contact 92 is formed through the ILD 90 to expose a portion of the source/drain structure. The opening may be formed using acceptable photolithography and etching techniques. In some embodiments, at least a portion of the capping layer, if present, and/or the etched back second epitaxial layer 86' is removed during the formation of the opening. In some embodiments, the etching process for contact opening may recess the exposed portion source/drain structure (including the capping layer if present) about 2 nm. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 90. The remaining liner and conductive material form contacts 92 in the openings. An anneal process may be performed to form a silicide at the interface between the source/drain regions 86'/80' (if present, capping layer) and the contact 92. In some embodiments, the silicide is formed in the recessed portion of the exposed source/drain structure discussed above. The contact 92 is physically and electrically coupled to the source/drain regions 86'/80' (if present, capping layer).

Although not explicitly shown, a person having ordinary skill in the art will readily understand that further processing steps may be performed on the structure in FIG. 15. For example, various inter-metal dielectrics (IMD) and their corresponding metallizations may be formed over ILD 90. Further, contacts to the gate electrode 68 may be formed through overlying dielectric layers.

Further, in some embodiments, a gate-last process (sometimes referred to as replacement gate process) may be used. In those embodiments, the gate electrode 68 and the gate dielectric 66 may be considered dummy structures and will be removed and replaced with an active gate and active gate dielectric during subsequent processing.

Although the embodiments in FIGS. 2 through 15 illustrate three fins for each FinFET, other embodiments contemplate more or less fins for each FinFET. Further, although the embodiments in FIGS. 2 through 15 illustrate a crown structure, other structures, such as FinFETs without crown structures, may also utilize the features of the current disclosure.

Figure 16:
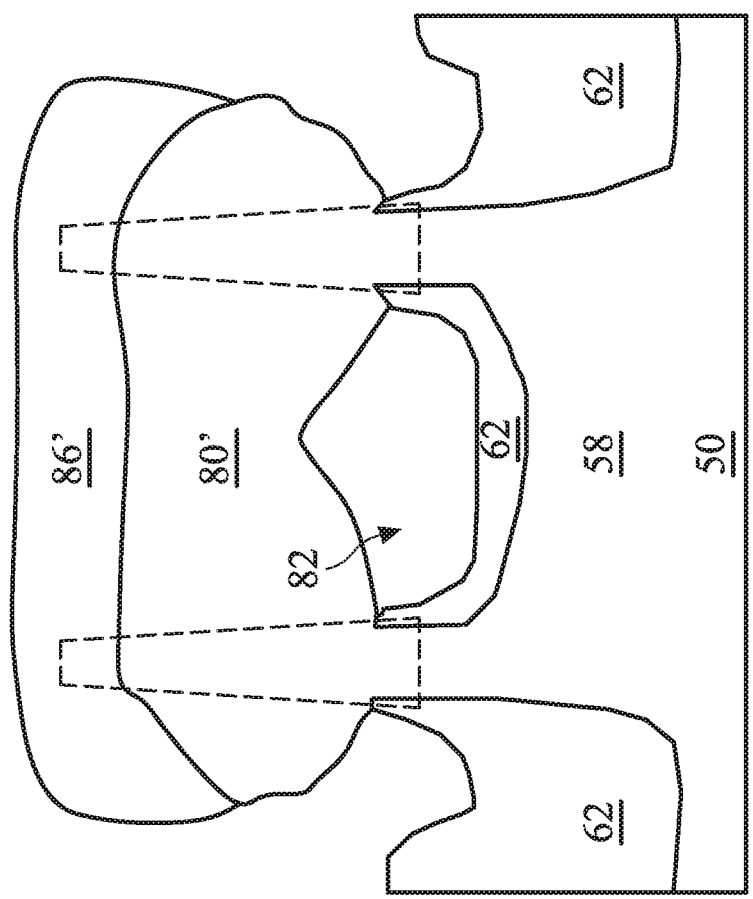
FIG. 16 is a cross-sectional view of an intermediate stage in the manufacturing of FinFETs in accordance with some embodiments.

FIG. 16 is a cross-sectional view of an intermediate stage in the manufacturing of FinFETs in accordance with an exemplary embodiment. FIG. 16 illustrates cross-section C-C of FIG. 1. This embodiment is similar to the embodiments described above in FIGS. 2 through 15 except that this embodiment includes two fins on the crown structure 58. Details regarding this embodiment that are similar to those for the previously described embodiment will not be repeated herein.

In some embodiments, the structure in FIG. 16 may be used for an n-type metal-oxide-semiconductor (NMOS) transistor in an SRAM device. For example, the device in FIG. 16 may be used as a pull-down transistor in the SRAM device. In this embodiment, the source/drain regions 80 may comprise SiC, SiP, SiCP, or the like. Similar to the previous embodiments, some portion of the isolation regions 62 remains near the opening of the recess that is formed when the semiconductor fin 64 is etched back. This remaining isolation region 62 helps to form the air gaps 82 between adjacent semiconductor fins 64. Also similar to the previous embodiments, by having the environment for the etch back processes be high temperature and low pressure, the shape of the source/drain regions 86'/80' can be controlled to have non-faceted tops 86A' such that the epitaxial source/drain material fills the intra-fin area.

Although not shown, this embodiment can also include the remaining portion of the gate seal spacer 72 on the remaining portion of the isolation region 62 between the adjacent fins.

Embodiments may achieve advantages. For example, the present disclosure is a semiconductor device and method of forming the same to provide a process flow to achieve a non-faceted epitaxial source/drain in a FinFET for device enhancement. In addition, this non-faceted epitaxial source/drain increases the contact landing area which can reduce the contact resistance to the source/drain region.

The process flow includes a first deposition process followed by a first etch back process followed by a second deposition process and a second etch back process. Each of the deposition processes includes silane ($SiH_4$) as a precursor for growing, for example, silicon phosphorous (SiP) source/drain regions. Each of the etch back processes are performed in high temperature and low pressure environments and may include $SiH_4$ as a precursor and hydrochloric acid (HCl) as a precursor. In some embodiments, the etch back processes do not include SiH4 as a precursor. The high temperature for the etch back processes may be in a range from about 650° C. to about 800° C. The low pressure for the etch back processes may be in a range from 1 torr to about 50 torr. By having the environment for the etch back processes be high temperature and low pressure, the shape of the source/drain can be controlled to have non-faceted tops as the SiH4 will passivate the top surfaces (100 orientation) while the HCl will etch the sides (110 orientation) of the source/drain regions from about 1 to about 20 times, such as about 4 times the rate of the top surfaces of the source/drain regions. In some embodiments, the disclosed process flow can be used in the formation of static random access memory (SRAM) devices.

An embodiment is a method including: forming a raised portion of a substrate; forming fins on the raised portion of the substrate; forming an isolation region surrounding the fins, a first portion of the isolation region being on a top surface of the raised portion of the substrate between adjacent fins; forming a gate structure over the fins; and forming source/drain regions on opposing sides of the gate structure, wherein forming the source/drain regions includes: epitaxially growing a first epitaxial layer on the fin adjacent the gate structure; etching back the first epitaxial layer; epitaxially growing a second epitaxial layer on the etched first epitaxial layer; and etching back the second epitaxial layer, the etched second epitaxial layer having a non-faceted top surface, the etched first epitaxial layer and the etched second epitaxial layer forming source/drain regions. In an embodiment, the method further includes an air gap separating at least one source/drain region from the first portion of the isolation region. In an embodiment, the method further includes forming a gate seal spacer on sidewalls of the gate structure, a first portion of the gate seal spacer being between the first portion of the isolation region and the air gap. In an embodiment, the forming the source/drain regions further includes: recessing the fins outside of the gate structure to have top surfaces below a top surface of the isolation region; and epitaxially growing the first epitaxial layer from the recessed fins on opposing sides of the gate structures. In an embodiment, the first epitaxial layer and the second epitaxial layer include silicon phosphorous (SiP). In an embodiment, the etching back the first epitaxial layer and etching back the second epitaxial layer are performed in an environment having a first temperature and at a first pressure, the first temperature being in a range from 650° C. to 800° C. and the first pressure being in a range from 1 torr to 50 torr. In an embodiment, the etching back the first epitaxial layer and etching back the second epitaxial layer includes etching the first epitaxial layer and the second epitaxial layer with hydrochloric acid. In an embodiment, after epitaxially growing the first epitaxial layer on the fin adjacent the gate structure and before etching back the first epitaxial layer, a top surface of the first epitaxial layer has first facets, wherein the etching back the first epitaxial layer removes the first facets. In an embodiment, the first facets have (111) crystalline orientations. In an embodiment, after etching back the first epitaxial layer, a top surface of the etched first epitaxial layer is lower than the top surface of the fins in a fin area and in an area between adjacent fins. In an embodiment, after etching back the second epitaxial layer, the non-faceted top surface of the etched second epitaxial layer is higher than the top surface of the fins in the fin area and in the area between adjacent fins.

Another embodiment is a method including: forming a first fin over a substrate; forming an isolation region surrounding the first fin; forming a first gate structure over the first fin; recessing the first fin outside of the first gate structure to have a top surface below a top surface of the isolation region; and forming a first source/drain region from the recessed first fin outside of the first gate structure, wherein forming the first source/drain region includes: epitaxially growing a first epitaxial layer from the recessed first fin adjacent the first gate structure; etching back the first epitaxial layer with a first etch back process, the first etch back process including SiH4 and HCl; epitaxially growing a second epitaxial layer on the etched first epitaxial layer; and etching back the second epitaxial layer with a second etch back process, the second etch back process including SiH4 and HCl, the etched first epitaxial layer and the etched second epitaxial layer forming the first source/drain region. In an embodiment, the method further includes forming a gate seal spacer on sidewalls of the first gate structure, a first portion of the gate seal spacer being on the isolation region, the first portion of the gate seal spacer having a top surface above a top surface of the recessed first fin. In an embodiment, the method further includes forming a second fin over the substrate, the second fin being adjacent the first fin, the isolation region surrounding the second fin, the first gate structure being over the second fin; recessing the second fin outside of the first gate structure to have a top surface below a top surface of the isolation region; and epitaxially growing a second source/drain region from the recessed second fin outside of the first gate structure, the first source/drain region and the second source/drain region merge together to form a continuous source/drain region, the isolation region forming an air gap between a top surface of the isolation region and the continuous source/drain region. In an embodiment, the method further includes forming a gate seal spacer on sidewalls of the first gate structure, a first portion of the gate seal spacer being on the isolation region, the first portion of the gate seal spacer being between the air gap and the isolation region. In an embodiment, the the first epitaxial layer and the second epitaxial layer include silicon phosphorous (SiP).

A further embodiment is a structure including: a raised portion of a substrate; a first fin over the raised portion of the substrate; a second fin over the substrate, the second fin being adjacent the first fin; an isolation region surrounding the first fin and the second fin; a gate structure along sidewalls and over upper surfaces of the first fin and the second fin; a source/drain region on the first fin and the second fin adjacent the gate structure, the source/drain region having a non-faceted top surface; and an air gap separating the source/drain region from a top surface of the raised portion of the substrate. In an embodiment, the non-faceted top surface of the source/drain region is higher than top surfaces of the first fin and the second fin in an area between the first fin and the second fin. In an embodiment, the source/drain region includes silicon phosphorous (SiP). In an embodiment, the structure further includes a first portion of the isolation region is between the air gap and the top surface of the raised portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a raised portion of a substrate;
   a first fin over the raised portion of the substrate;
   a second fin over the substrate, the second fin being adjacent the first fin;
   an isolation region surrounding the first fin and the second fin;
   a gate structure along sidewalls and over upper surfaces of the first fin and the second fin;
   a source/drain region on the first fin and the second fin adjacent the gate structure, the source/drain region having a non-faceted top surface; and
   an air gap separating the source/drain region from a top surface of the raised portion of the substrate, wherein a first portion of the source/drain region extends below the top surface of the raised portion of the substrate.

2. The structure of claim 1, wherein the non-faceted top surface of the source/drain region is higher than top surfaces of the first fin and the second fin in an area between the first fin and the second fin.

3. The structure of claim 1, wherein the source/drain region further comprises sides having faceted surfaces, each of the sides having two facets that are non-perpendicular and non-parallel to a major surface of the substrate and another facet that is perpendicular to the major surface of the substrate.

4. The structure of claim 1, wherein a first portion of the isolation region is between the air gap and the top surface of the raised portion of the substrate.

5. The structure of claim 1, wherein the source/drain region comprises silicon phosphide (SiP).

6. The structure of claim 1, further comprising a gate seal spacer on sidewalls of the gate structure, a first portion of the gate seal spacer being on the isolation region.

7. The structure of claim 1, wherein the first portion of the source/drain region has a lower doping concentration than a second portion of the source/drain region that is above the top surface of the raised portion of the substrate.

8. The structure of claim 1, wherein the faceted surfaces of the sides comprises facets with a no orientation.

9. A semiconductor device, comprising:
   a plurality of fins protruding from a substrate;
   an isolation region surrounding the plurality of fins;
   a gate structure over the plurality of fins, the gate structure extending across the plurality of fins; and
   an epitaxial source/drain region adjacent the gate structure, the epitaxial source/drain region extending across the plurality of fins, the epitaxial source/drain region comprising a first surface that faces away from the substrate and a second surface that faces toward the substrate, wherein the first surface is a non-faceted surface and the second surface is a faceted surface, wherein the second surface comprises facets with a no orientation.

10. The semiconductor device of claim 9, further comprising an air gap between two adjacent fins of the plurality of fins, wherein the air gap extends between the second surface of the epitaxial source/drain region and a top surface of the isolation region.

11. The semiconductor device of claim 9, further comprising a gate seal spacer on a sidewall of the gate structure, wherein a portion of the gate seal spacer extends over the isolation region.

12. The semiconductor device of claim 9, wherein the epitaxial source/drain region further comprises a third surface that is faceted and that faces away from the substrate, wherein the third surface is closer to the substrate than the first surface.

13. The semiconductor device of claim 9, wherein the second surface is concave.

14. A structure comprising:
   a first fin over a substrate;
   a second fin over the substrate, the second fin being adjacent a first side of the first fin;
   an isolation region surrounding the first fin and the second fin, a first portion of the isolation region being between the first fin and the second fin and a second portion of the isolation region being adjacent a second side of the first fin, wherein the second side is opposite the first side;
   a gate structure along sidewalls and over upper surfaces of the first fin and the second fin, the gate structure defining channel regions in the first fin and the second fin; and
   a source/drain region on the first fin and the second fin adjacent the gate structure, the source/drain region comprising a non-faceted top surface and a faceted sidewall surface, the faceted sidewall surface being perpendicular to a major surface of the substrate.

15. The structure of claim 14, wherein the non-faceted top surface of the source/drain region is level.

16. The structure of claim 15, wherein a first portion of the source/drain region extends below the top surface of the of the substrate.

17. The structure of claim 14, wherein a bottom surface of the first portion of the isolation region is farther from the substrate than a bottom surface of the second portion of the isolation region.

18. The structure of claim 14, wherein a first vertical thickness of the source/drain region over the first fin is greater than a second vertical thickness of the source/drain region between the first fin and the second fin.

19. The structure of claim 18, wherein the first vertical thickness is twice the second vertical thickness.

20. The structure of claim 14, further comprising an air gap between the source/drain region and the first portion of the isolation region.

* * * * *